United States Patent
Wang et al.

(10) Patent No.: US 11,646,451 B2
(45) Date of Patent: May 9, 2023

(54) SEMICONDUCTOR DEVICE, MANUFACTURING METHOD THEREOF, AND POWER GENERATING DEVICE

(71) Applicant: BOE TECHNOLOGY GROUP CO., LTD., Beijing (CN)

(72) Inventors: Zhidong Wang, Beijing (CN); Lijia Zhou, Beijing (CN); Quanguo Zhou, Beijing (CN); Ronghua Lan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 292 days.

(21) Appl. No.: 16/765,967

(22) PCT Filed: Dec. 18, 2019

(86) PCT No.: PCT/CN2019/126264
§ 371 (c)(1),
(2) Date: May 21, 2020

(87) PCT Pub. No.: WO2020/140757
PCT Pub. Date: Jul. 9, 2020

(65) Prior Publication Data
US 2021/0226257 A1    Jul. 22, 2021

(30) Foreign Application Priority Data
Jan. 2, 2019   (CN) .......................... 201910001406.4

(51) Int. Cl.
*H01M 10/0585*   (2010.01)
*H01M 50/284*    (2021.01)
(Continued)

(52) U.S. Cl.
CPC ... *H01M 10/0585* (2013.01); *H01M 10/0436* (2013.01); *H01M 50/284* (2021.01);
(Continued)

(58) Field of Classification Search
CPC .................................................. H01M 10/0436
See application file for complete search history.

(56) References Cited

U.S. PATENT DOCUMENTS

| 10,109,887 B1 | 10/2018 | Bhardwaj et al. |
| 2005/0079418 A1 | 4/2005 | Kelley et al. |
(Continued)

FOREIGN PATENT DOCUMENTS

| CN | 105098249 A | 11/2015 |
| CN | 106409878 A | 2/2017 |
(Continued)

OTHER PUBLICATIONS

Gu, Long, Application of Triboelectric Nanogenerator of Harvesting Sound Energy, Dec. 2, 2016.
(Continued)

*Primary Examiner* — Jonathan Crepeau
(74) *Attorney, Agent, or Firm* — The Webb Law Firm (57) ABSTRACT

The present disclosure provides a semiconductor device, a manufacturing method thereof, and a power generating device. The semiconductor device includes a substrate and a thin film battery on the substrate. The thin film battery includes at least one anode structure and at least one cathode structure on the substrate, and a solid electrolyte layer spacing the at least one anode structure apart from the at least one cathode structure. Each anode structure includes an anode current collector on a surface of the substrate and an anode layer on the surface of the substrate and connected to a side surface of the anode current collector. Each cathode structure includes a cathode current collector on the surface of the substrate and a cathode layer on the surface of the substrate and connected to a side surface of the cathode current collector.

16 Claims, 4 Drawing Sheets (51) Int. Cl.
  *H01M 10/04*   (2006.01)
  *H02N 1/04*    (2006.01)
  *H01M 6/40*    (2006.01)
  *H01L 27/13*   (2006.01)
  *H02J 7/32*    (2006.01)

(52) U.S. Cl.
  CPC ............. *H01L 27/13* (2013.01); *H01M 6/40* (2013.01); *H01M 2220/30* (2013.01); *H01M 2300/0071* (2013.01); *H01M 2300/0082* (2013.01); *H02J 7/32* (2013.01); *H02N 1/04* (2013.01)

(56) References Cited

U.S. PATENT DOCUMENTS

2013/0280598 A1* 10/2013 Shigematsu ...... H01M 10/0525
　　　　　　　　　　　　　　　　　　　429/163
2016/0294016 A1  10/2016 Asai et al.
2017/0352922 A1  12/2017 Langlois et al.
2020/0335558 A1  10/2020 Zhou et al.

FOREIGN PATENT DOCUMENTS

| CN | 107170956 A  | 9/2017  |
| CN | 206931653 U  | 1/2018  |
| CN | 109037303 A  | 12/2018 |
| CN | 109728026 A  | 5/2019  |

OTHER PUBLICATIONS

Sun, Jia, "Inorganic electric-double-layer gate dielectrics and its application in low-voltage oxide micro-nanotransistors", May 2012, Hunan University.

Wan, Qing, "Oxide Electric Double Layer Transistor and Its Application in Neurobionic Electronics", CFMTIF '15, 2015, pp. 58-59, China Academic Journal Electronic Publishing House.

* cited by examiner

SEMICONDUCTOR DEVICE, MANUFACTURING METHOD THEREOF, AND POWER GENERATING DEVICE

CROSS-REFERENCE TO RELATED APPLICATIONS

This application is the United States national phase of International Application No. PCT/CN2019/126264 filed Dec. 18, 2019, and claims priority to Chinese Patent Application No. 201910001406.4, filed Jan. 2, 2019, the disclosures of which are hereby incorporated by reference in their entirety.

TECHNICAL FIELD

The present disclosure relates to a semiconductor device, a manufacturing method thereof, and a power generating device.

BACKGROUND

In recent years, micro-systems such as portable electronic devices (for example, wearable devices) and implantable electronic medical devices have gradually become research hotspots. These systems generally comprise thin film transistors (which may be used as switches) and thin film batteries.

SUMMARY

According to an aspect of the embodiments of the present disclosure, a semiconductor device is provided. The semiconductor device comprises: a substrate; a thin film battery on the substrate, comprising: at least one anode structure on the substrate, each of which comprises an anode current collector on a surface of the substrate, and an anode layer on the surface of the substrate and connected to a side surface of the anode current collector; at least one cathode structure on the substrate, each of which comprises a cathode current collector on the surface of the substrate, and a cathode layer on the surface of the substrate and connected to a side surface of the cathode current collector; and a solid electrolyte layer spacing the at least one anode structure apart from the at least one cathode structure.

In some embodiments, the semiconductor device further comprises at least one thin film transistor on the substrate, each of which comprises: a first electrode on the substrate, a second electrode on the substrate, an active layer on the substrate, wherein the active layer is between the first electrode and the second electrode and connected to the first electrode and the second electrode; a dielectric layer on a side of the active layer facing away from the substrate; and a gate on a side of the dielectric layer facing away from the active layer.

In some embodiments, materials of the first electrode and the second electrode are the same as a material of the anode current collector; or the materials of the first electrode and the second electrode are the same as a material of the cathode current collector.

In some embodiments, a material of the dielectric layer is the same as a material of the solid electrolyte layer.

In some embodiments, a material of the gate is the same as a material of the cathode current collector or a material of the anode current collector.

According to another aspect of the present disclosure, a power generating device is provided. The power generating device comprises: the semiconductor device as described above; and a nano-generator electrically connected to the semiconductor device.

In some embodiments, the nano-generator comprises a first electrode layer, a second electrode layer, and a first material layer and a second material layer between the first electrode layer and the second electrode layer, wherein the first material layer is in contact with the first electrode layer, and the second material layer is in contact with the second electrode layer; and the at least one thin film transistor comprises: a first thin film transistor, of which a first electrode is electrically connected to the anode current collector of the thin film battery, a second electrode and a gate each is electrically connected to the first electrode layer of the nano-generator, and a second thin film transistor, of which a first electrode is electrically connected to the cathode current collector of the thin film battery, and a second electrode and a gate each is electrically connected to the second electrode layer of the nano-generator.

In some embodiments, wherein the first thin film transistor is an NMOS transistor, and the second thin film transistor is a PMOS transistor.

According to another aspect of the present disclosure, a manufacturing method for a semiconductor device is provided. The manufacturing method comprises: forming at least one anode structure and at least one cathode structure on a substrate, wherein each of the at least one anode structure comprises an anode current collector on a surface of the substrate and an anode layer on the surface of the substrate and connected to a side surface of the anode current collector, and each of the at least one cathode structure comprises a cathode current collector on the surface of the substrate and a cathode layer on the surface of the substrate and connected to a side surface of the cathode current collector; and forming a solid electrolyte layer on the substrate, the at least one anode structure and the at least one cathode structure, wherein the solid electrolyte layer spaces the at least one anode structure apart from the at least one cathode structure.

In some embodiments, the forming of the at least one anode structure and the at least one cathode structure on the substrate comprises: forming at least one anode current collector and at least one cathode current collector spaced apart from the at least one anode current collector on the substrate; filling an anode material between the at least one anode current collector and the at least one cathode current collector; patterning the anode material to form the anode layer, wherein the anode layer is spaced apart from the at least one cathode current collector; filling a cathode material between the anode layer and the at least one cathode current collector; and patterning the cathode material to form the cathode layer, wherein the cathode layer is spaced apart from the anode layer.

In some embodiments, the forming of the at least one anode structure and the at least one cathode structure on the substrate comprises: forming at least one anode current collector and at least one cathode current collector spaced apart from the at least one anode current collector on the substrate; filling a cathode material between the at least one anode current collector and the at least one cathode current collector; patterning the cathode material to form the cathode layer, wherein the cathode layer is spaced apart from the at least one anode current collector; filling an anode material between the cathode layer and the at least one anode current collector; and patterning the anode material to form the anode layer, wherein the anode layer is spaced apart from the cathode layer.

In some embodiments, the forming of the at least one anode structure and the at least one cathode structure on the substrate comprises: forming at least one anode current collector and at least one cathode current collector spaced apart from the at least one anode current collector on the substrate; forming the anode layer and the cathode layer by a three-dimensional printing process respectively; and connecting the anode layer to a side surface of the at least one anode current collector, and connecting the cathode layer to a side surface of the at least one cathode current collector, wherein the cathode layer is spaced apart from the anode layer.

In some embodiments, the manufacturing method further comprises: forming a first electrode and a second electrode spaced apart from the first electrode the substrate during the forming of the at least one anode current collector and the at least one cathode current collector; forming an active layer between the first electrode and the second electrode on the substrate, wherein the active layer is connected to the first electrode and the second electrode; forming a dielectric layer on the active layer during the forming of the solid electrolyte layer; and forming a gate on the dielectric layer after forming the solid electrolyte layer.

In some embodiments, materials of the first electrode and the second electrode are the same as a material of the anode current collector, or the materials of the first electrode and the second electrode are the same as a material of the cathode current collector.

In some embodiments, a material of the dielectric layer is the same as a material of the solid electrolyte layer.

In some embodiments, a material of the gate is the same as a material of the cathode current collector, or the material of the gate is the same as a material of the anode current collector.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail in conjunction with the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include", or the like means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventors of the present disclosure have found that in the related art, a thin film battery having a longitudinal structure is vertically disposed on a substrate, which results in that a cathode current collector or an anode current collector of the thin film battery is located on a top. In this way, when the thin film battery is connected to other devices, there is height difference between the cathode current collector or the anode current collector and structural layers (for example, a source layer, a drain layer, or a gate layer) of the other devices, which results in that a metal connecting line between the cathode current collector or the anode current collector and the structural layers of the other devices is likely to break.

In view of this, the embodiments of the present disclosure provide a semiconductor device to reduce the possibility that the above-described metal connecting line breaks. Hereinafter, a semiconductor device according to some embodiments of the present disclosure will be described in detail in conjunction with the accompanying drawings.

Figure 1:
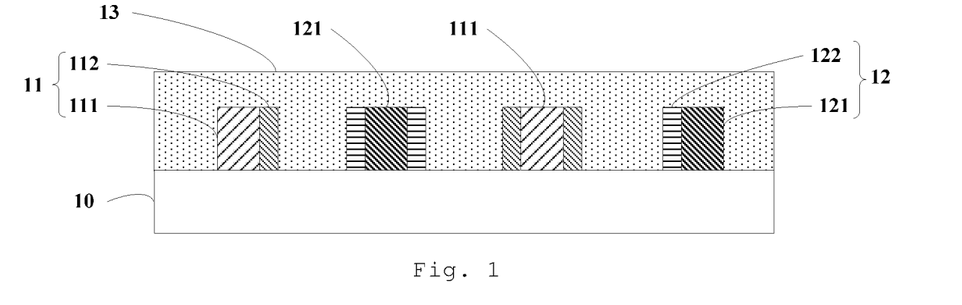
FIG. 1 is a schematic cross-sectional view showing a semiconductor device according to an embodiment of the present disclosure.

FIG. 1 is a schematic cross-sectional view showing a semiconductor device according to an embodiment of the present disclosure. As shown in FIG. 1, the semiconductor device comprises a substrate 10 and a thin film battery on the substrate 10.

As shown in FIG. 1, the thin film battery comprises: at least one anode structure 11 on the substrate 10 and at least one cathode structure 12 on the substrate 10, and a solid electrolyte layer 13 spacing the at least one anode structure 11 apart from the at least one cathode structure 12. The solid electrolyte layer 13 is on a surface of the substrate 10. The solid electrolyte layer 13 covers the anode structure 11 and the cathode structure 12.

In some embodiments, a material of the solid electrolyte layer may comprise at least one of an organic polyelectrolyte material or an inorganic electrolyte material. For example, the organic polyelectrolyte material may comprise polyvinyl alcohol+potassium fluoride (PVA+KF), polyethylene oxide+lithium hexafluorophosphate (PEO+LiPF$_6$), or the like. For example, the inorganic electrolyte material may comprise porous $SiO_2$, porous $Al_2O_3$, composite materials comprising $CaCl_2$) and porous $SiO_2$, composite materials comprising LiCl and porous $SiO_2$, $SiO_2$ nanoparticles, $Al_2O_3$ nanoparticles, zeolite, phosphosilicate glass, or the like.

As shown in FIG. 1, each anode structure 11 comprises: an anode current collector 111 on the surface of the substrate 10 and an anode layer 112 on the surface of the substrate 10 and connected to a side surface of the anode current collector 111. For example, one anode layer 112 may be connected to one side surface of the anode current collector 111, or the anode layer 112 may be connected to both side surfaces of the anode current collector 111. For example, different anode current collectors may be electrically connected, and may be led out through a same wire.

As shown in FIG. 1, each cathode structure 12 comprises: a cathode current collector 121 on the surface of the substrate 10 and a cathode layer 122 on the surface of the substrate 10 and connected to a side surface of the cathode current collector. For example, one cathode layer 122 may be connected to one side surface of the cathode current collector 121, or the cathode layer 122 may be connected to both side surfaces of the cathode current collector 121. For example, different cathode current collectors may be electrically connected, and may be led out through a same wire.

So far, a semiconductor device according to some embodiments of the present disclosure has been provided. In this semiconductor device, an anode current collector, an anode layer, a cathode current collector, and a cathode layer are provided on the surface of the substrate. A solid electrolyte layer is also provided on the surface of the substrate, and the solid electrolyte layer spaces the anode structure apart from the cathode structure. Such structure of the thin film battery may be referred to as a transverse structure. That is, this thin film battery has a transverse structure. This may reduce the height of the cathode current collector, the anode current collector or the like. When the thin film battery is connected to structural layers of other devices (for example, thin film transistors), the height difference between the cathode current collector or the anode current collector of the thin film battery and the structural layers of the other devices may be reduced. Therefore, it is possible to reduce the possibility that the metal connecting line between the cathode current collector or the anode current collector and the structural layer of the other devices breaks.

Figure 2:
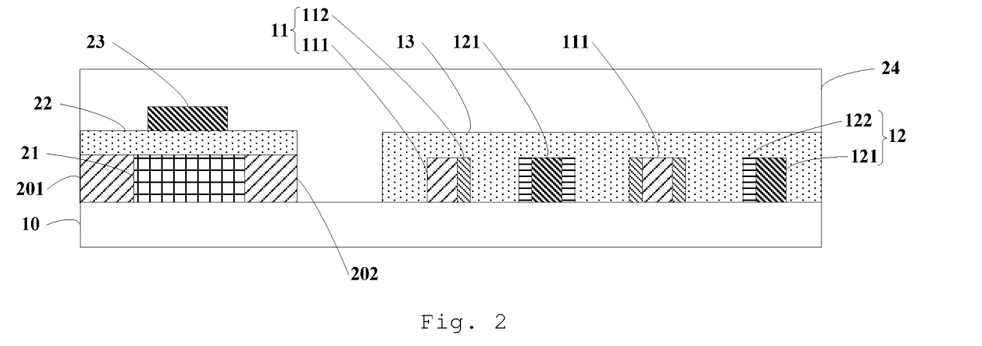
FIG. 2 is a schematic cross-sectional view showing a semiconductor device according to another embodiment of the present disclosure.

FIG. 2 is a schematic cross-sectional view showing a semiconductor device according to another embodiment of the present disclosure. As shown in FIG. 2, the semiconductor device comprises a substrate 10 and a thin film transistor on the substrate 10. The thin film transistor has the same or similar structure as the thin film transistor shown in FIG. 1, and thus will not be described in detail here.

In some embodiments, as shown in FIG. 2, the semiconductor device may further comprise at least one thin film transistor on the substrate 10. The at least one thin film transistor and the thin film battery are located on the same side surface of the substrate 10. It should be noted that, although one thin film transistor is shown in FIG. 2, those skilled in the art may understand that two or more thin film transistors may be provided on the substrate.

In some embodiments, as shown in FIG. 2, each thin film transistor comprises a first electrode (for example, a source) 201, a second electrode (for example, a drain) 202 and an active layer 21 on the substrate 10. The active layer 21 is a semiconductor layer. For example, a material of the active layer 21 may comprise at least one of polysilicon or amorphous silicon. The first electrode 201 and the second electrode 202 are respectively on both side surfaces of the active layer 21. That is, the active layer 21 is between the first electrode 201 and the second electrode 202. The first electrode 201 and the second electrode 202 each is connected to the active layer 21.

In some embodiments, as shown in FIG. 2, each thin film transistor may further comprise a dielectric layer 22 on a side of the active layer 21 facing away from the substrate 10. For example, the dielectric layer 22 is on the first electrode 201, the second electrode 202, and the active layer 21.

In some embodiments, as shown in FIG. 2, each thin film transistor may further comprise a gate 23 on a side of the dielectric layer 22 facing away from the active layer 21. The gate 23 is on the dielectric layer 22.

So far, a semiconductor device according to other embodiments of the present disclosure has been provided. In the semiconductor device, a thin film battery and at least one thin film transistor are integrated on the substrate, which improves the integration of the semiconductor device. Since the thin film battery has a transverse structure, the height difference between the thin film battery and the thin film transistor may be reduced. In this way, when the cathode current collector or the anode current collector of the thin film battery is connected to the electrodes (for example, the source, the drain, or the gate) of the thin film transistor, the possibility of the metal connecting line between them being broken may be reduced. Therefore, when the semiconductor device is applied to a flexible display device such as a wearable device, the possibility of the flexible display device being damaged may be reduced.

In some embodiments, as shown in FIG. 2, the semiconductor device may further comprise a planarization layer 24 covering the thin film battery and the thin film transistor. For example, a material of the planarization layer 24 may comprise organic materials such as resin.

In some embodiments, the semiconductor device may further comprise an encapsulation layer or the like (not shown) on the planarization layer 24.

In some embodiments, materials of the first electrode 201 and the second electrode 202 are the same as a material of the anode current collector 111. In other embodiments, the materials of the first electrode 201 and the second electrode 202 are the same as a material of the cathode current collector 121. In this way, during the process of integrating the thin film transistor and the thin film battery, it is possible to facilitate the manufacture.

In some embodiments, a material of the gate 23 is the same as the material of the cathode current collector 121. In other embodiments, the material of the gate 23 is the same as the material of the anode current collector 111. This may reduce the types of materials used during a manufacturing process and also facilitate the manufacture.

In some embodiments, a material of the dielectric layer 22 may be the same as a material of the solid electrolyte layer 13. When no voltage is applied to the gate of the thin film transistor, the positive and negative ions in the solid electrolyte as the dielectric layer are freely distributed, and the entire dielectric layer is electrically neutral. In this embodiment, by using a solid electrolyte material as a dielectric layer, it may not only facilitate the manufacture, but also reduce the turn-on voltage (or driving voltage) of the thin film transistor.

The operation principles of the thin film transistor with the solid electrolyte as the dielectric layer will be introduced in detail below in conjunction with FIGS. 3A and 3B.

Figure 3A:
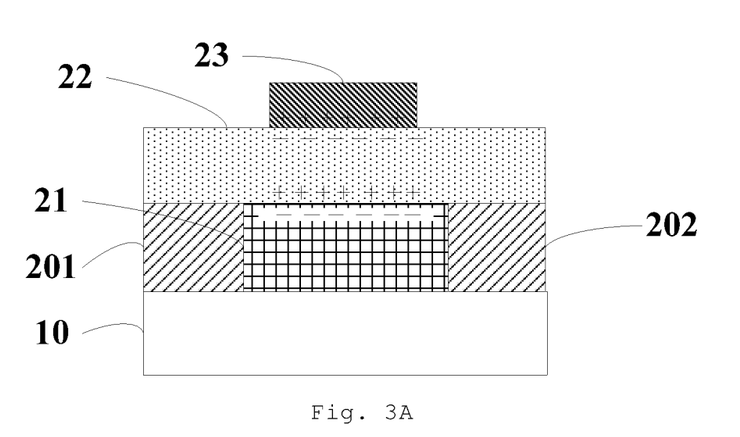
FIG. 3A is a schematic view showing that a thin film transistor according to an embodiment of the present disclosure generates an electric-double-layer capacitance under the action of a positive bias.

FIG. 3A is a schematic view showing that a thin film transistor according to an embodiment of the present disclosure generates an electric-double-layer capacitance under the action of a positive bias. FIG. 3B is a schematic view showing that a thin film transistor according to an embodiment of the present disclosure generates an electric-double-layer capacitance under the action of a negative bias. For example, the thin film transistors in FIGS. 3A and 3B are n-channel transistors.

As shown in FIG. 3A, when a positive bias is applied to the gate electrode 23, the positive and negative ions in the dielectric layer 22 using a solid electrolyte material may directionally move under the action of an electric field generated by the positive bias. Positive ions may be accumulated at the interface between the dielectric layer 22 and the active layer 21, and induce a layer of mirror-image charges on the surface of the active layer 21 that is electrically opposite to the positive ions. This layer of mirror-image charges and the positive ion layer may form a strong interface capacitance, thereby forming an electric-double-layer capacitor. For n-channel transistors, the layer of mirror-image charges are an accumulated electron layer. In this way, an n-type channel is formed in the active layer 21, so the thin film transistor is turned on.

In this device model, an electric-double-layer capacitor is formed at the interface of the dielectric layer/active layer and another electric-double-layer capacitor is formed at the interface of the gate/dielectric layer, that is, a total of two electric-double-layer capacitors are formed. The capacitance of the entire device may be seen as a series connection of these two electric-double-layer capacitors. Since the thickness of the electric-double-layer is very small (the thickness is a nanometer scale), the gate has a large unit capacitance, which may improve the coupling efficiency of the gate, and thus may reduce the turn-on voltage of the thin film transistor.

Figure 3B:
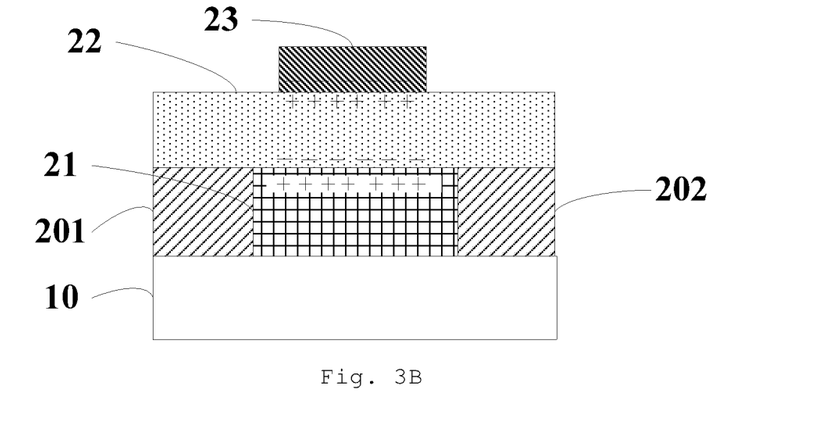
FIG. 3B is a schematic view showing that the thin film transistor according to an embodiment of the present disclosure generates an electric-double-layer capacitance under the action of a negative bias.

As shown in FIG. 3B, when a negative bias is applied to the gate electrode 23, the negative ions in the dielectric layer 22 may reach the interface of the dielectric layer 22 and the active layer 21 under the action of an electric field generated by the negative bias. Negative ions may be accumulated at the interface between the dielectric layer 22 and the active layer 21, and induce a layer of mirror-image charges on the surface of the active layer 21 that is electrically opposite to the negative ions. Therefore, for n-channel transistors, the positively charged mirror-image charges may be accumulated at the channel of the active layer 21, and the electrons in the channel are repelled and depleted by negative ions. Since the thin film transistor is an n-channel transistor, the thin film transistor is turn off in the case where the electrons are depleted.

Figure 4:
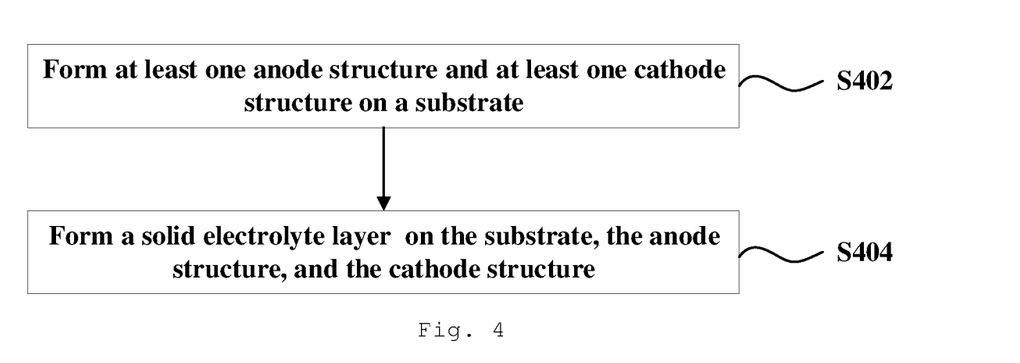
FIG. 4 is a flowchart showing a manufacturing method for a semiconductor device according to an embodiment of the present disclosure.

FIG. 4 is a flowchart showing a manufacturing method for a semiconductor device according to an embodiment of the present disclosure. As shown in FIG. 4, the manufacturing method may comprise steps S402 to S404.

At step S402, at least one anode structure and at least one cathode structure are formed on a substrate. Each anode structure comprises an anode current collector on a surface of the substrate and an anode layer on the surface of the substrate and connected to a side surface of the anode current collector. Each cathode structure comprises a cathode current collector on the surface of the substrate and a cathode layer on the surface of the substrate and connected to a side surface of the cathode current collector.

In some embodiments, the step S402 may comprise forming at least one anode current collector and at least one cathode current collector spaced apart from the at least one anode current collector on the substrate. Next, an anode material is filled between the at least one anode current collector and the at least one cathode current collector. Next, the anode material is patterned to form the anode layer. The anode layer is spaced apart from the cathode current collector. Next, a cathode material is filled between the anode layer and the cathode current collector. Next, the cathode material is patterned to form the cathode layer. The cathode layer is spaced apart from the anode layer. In this embodiment, after the anode current collector and the cathode current collector are formed, the anode layer is formed first, and then the cathode layer is formed, thereby forming the anode structure and the cathode structure.

In other embodiments, the step S402 may comprise forming at least one anode current collector and at least one cathode current collector spaced apart from the at least one anode current collector on the substrate. Next, a cathode material is filled between the at least one anode current collector and the at least one cathode current collector. Next, the cathode material is patterned to form the cathode layer. The cathode layer is spaced apart from the anode current collector. Next, an anode material is filled between the cathode layer and the anode current collector. Next, the anode material is patterned to form the anode layer. The anode layer is spaced apart from the cathode layer. In this embodiment, after the anode current collector and the cathode current collector are formed, the cathode layer is formed first, and then the anode layer is formed, thereby forming the cathode structure and the anode structure.

In other embodiments, the step S402 may comprise forming at least one anode current collector and at least one cathode current collector spaced apart from the at least one anode current collector on the substrate. The step S402 may further comprise forming the anode layer and the cathode layer by a three-dimensional (3D) printing process respectively. Next, the anode layer is connected to a side surface of the anode current collector, and the cathode layer is connected to a side surface of the cathode current collector. The cathode layer is spaced apart from the anode layer. In this embodiment, the anode current collector and the cathode current collector are formed, and the anode layer and the cathode layer are formed by the three-dimensional printing process respectively. The anode layer is connected to the side surface of the anode current collector and the cathode layer is connected to the side surface of the cathode current collector, thereby forming the anode structure and the cathode structure. The method is more simple and easy to implement.

At step S404, a solid electrolyte layer is formed on the substrate, the anode structure, and the cathode structure. The solid electrolyte layer spaces the anode structure apart from the cathode structure. The solid electrolyte layer covers the anode structure and the cathode structure.

So far, a manufacturing method for a semiconductor device according to some embodiments of the present disclosure is provided. In the manufacturing method, at least one anode structure and at least one cathode structure are formed on the substrate; and a solid electrolyte layer is formed on the substrate, the anode structure, and the cathode structure. The solid electrolyte layer spaces the anode structure apart from the cathode structure. In this way, a thin film battery having a transverse structure is formed on the substrate.

In some embodiments, the manufacturing method may further comprise forming a first electrode and a second electrode spaced apart from the first electrode on the substrate during the forming of the anode current collector and the cathode current collector. The first electrode and the second electrode serve as two electrodes of a thin film transistor. For example, materials of the first electrode and the second electrode are the same as a material of the anode current collector. For another example, the materials of the first electrode and the second electrode are the same as a material of the cathode current collector.

In some embodiments, the manufacturing method may further comprise forming an active layer between the first electrode and the second electrode on the substrate. The first electrode and the second electrode each is connected to the active layer. That is, the active layer is connected to the first electrode and the second electrode.

In some embodiments, the manufacturing method may further comprise forming a dielectric layer on the active layer during the forming of the solid electrolyte layer. For example, a material of the dielectric layer is the same as a material of the solid electrolyte layer.

In some embodiments, the manufacturing method may further comprise forming a gate on the dielectric layer after forming the solid electrolyte layer. For example, a material of the gate is the same as the material of the cathode current collector. For another example, the material of the gate is the same as the material of the anode current collector.

FIGS. 5 to 12 are schematic cross-sectional views showing structures at several stages during a manufacturing process of a semiconductor device according to some embodiments of the present disclosure. The manufacturing process of the semiconductor device according to some embodiments of the present disclosure will be described in detail below in conjunction with FIGS. 5 to 12 and FIG. 2.

Figure 5:
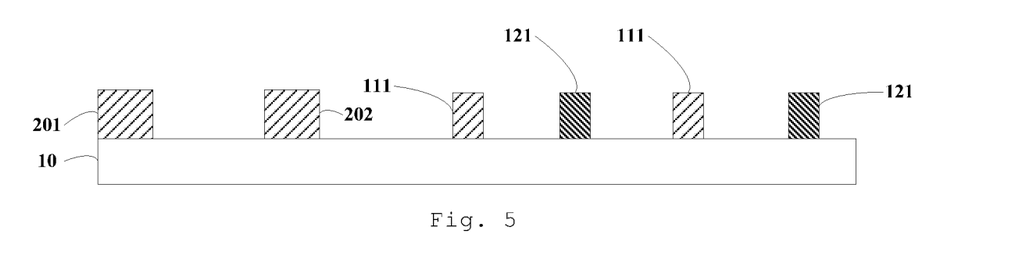
FIGS. 5 to 12 are schematic cross-sectional views showing structures at several stages during a manufacturing process for a semiconductor device according to some embodiments of the present disclosure.

First, as shown in FIG. 5, a substrate 10 is provided. For example, the substrate 10 may be a rigid substrate such as glass, or a flexible substrate such as PI (Polyimide) or PDMS (polydimethylsiloxane).

Next, as shown in FIG. 5, at least one anode current collector 111, at least one cathode current collector 121, a first electrode 201, and a second electrode 202 spaced apart from each other are formed on the substrate 10, for example by processes such as deposition, photo, etching, and the like. For example, materials of the first electrode 201 and the second electrode 202 are the same as a material of the anode current collector 111. Of course, those skilled in the art may understand that the materials of the first electrode 201 and the second electrode 202 may also be the same as a material of the cathode current collector 121.

Figure 6:
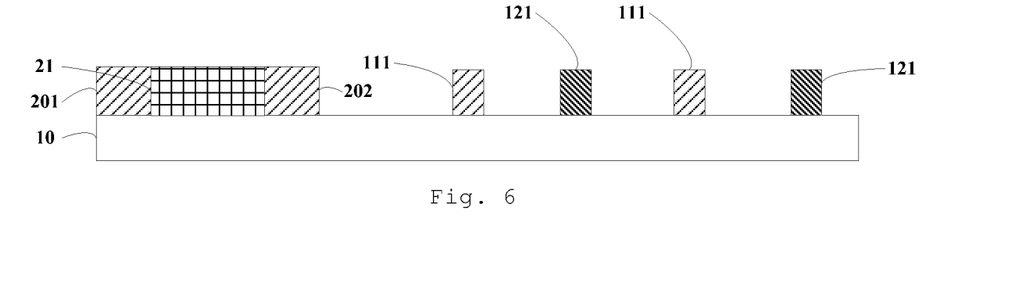

Next, as shown in FIG. 6, an active layer 21 located between the first electrode 201 and the second electrode 202 is formed on the substrate 10. The first electrode 201 and the second electrode 202 each is connected to the active layer 21. For example, the active layer 21 may be formed by processes such as plating, photo, and etching, or by an FMM (Fine Metal Mask) evaporation process. For example, the active layer 21 may use a semiconductor material doped with an n-type dopant (for example, phosphorus) in a case where an NMOS (N-channel Metal Oxide Semiconductor) transistor needs to be formed; and the active layer 21 may use a semiconductor material doped with a p-type dopant (for example, boron) in a case where a PMOS (P-channel Metal Oxide Semiconductor) transistor needs to be formed.

Figure 7:
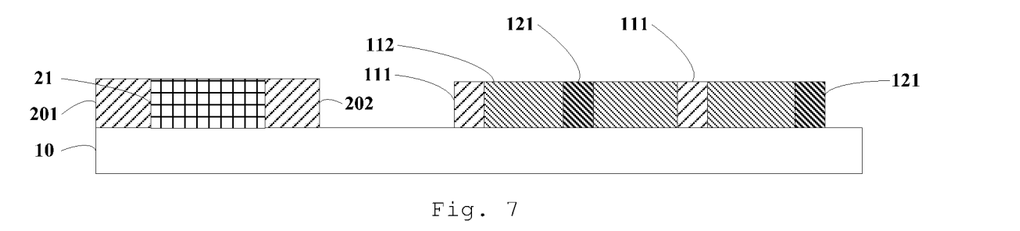

Next, as shown in FIG. 7, for example, an anode material 112 is filled between the anode current collector 111 and the cathode current collector 121 by an FMM evaporation process.

Figure 8:
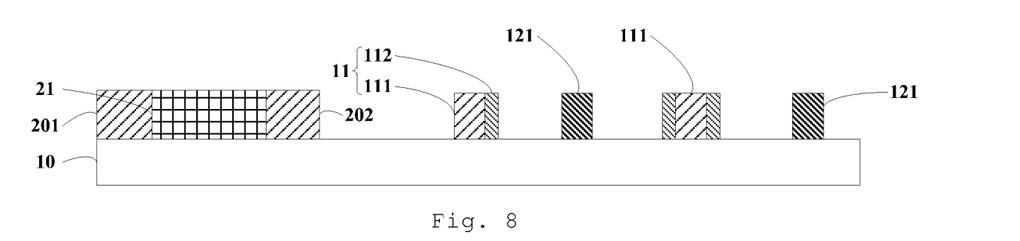

Next, as shown in FIG. 8, the anode material is patterned by processes such as photo, etching, and the like to form an anode layer 112. The anode layer 112 is spaced apart from the cathode current collector 121. This forms an anode structure 11. The anode structure 11 comprises the anode current collector 111 and the anode layer 112.

Figure 9:
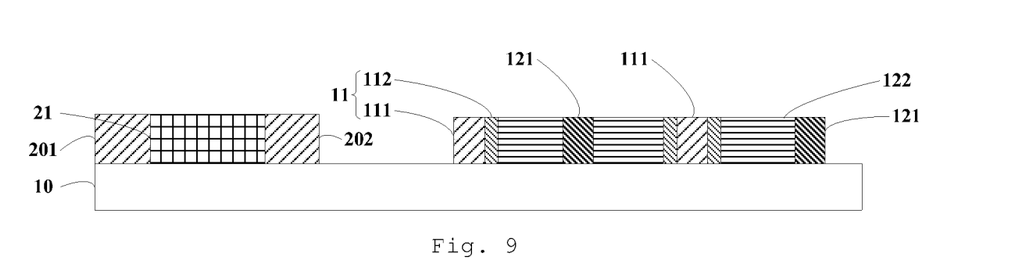

Next, as shown in FIG. 9, for example, a cathode material 122 is filled between the anode layer 112 and the cathode current collector 121 by an FMM evaporation process.

Figure 10:
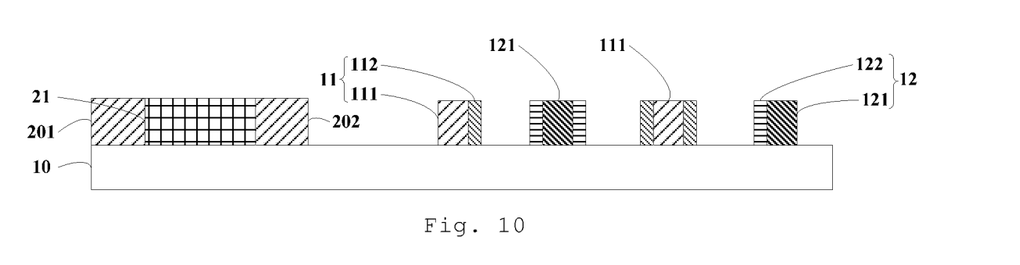

Next, as shown in FIG. 10, the cathode material is patterned to form a cathode layer 122 by processes such as photo, etching, and the like. The cathode layer 122 is spaced apart from the anode layer 112. This forms a cathode structure 12. The cathode structure 12 comprises the cathode current collector 121 and the cathode layer 122.

Figure 11:
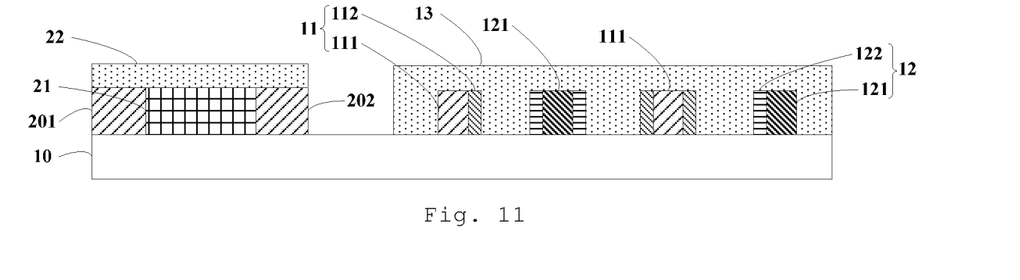

Next, as shown in FIG. 11, a solid electrolyte layer 13 is formed on the substrate 10, the anode structure 11 and the cathode structure 12, and a dielectric layer 22 is formed on the first electrode 201, the second electrode 202 and the active layer 21. A material of the dielectric layer 22 comprises a solid electrolyte material. The dielectric layer is spaced apart from the solid electrolyte layer 13. For example, a solid electrolyte material may be formed on the structure shown in FIG. 10 by processes such as sputtering and the like, and the solid electrolyte material is patterned by processes such as photo, etching, and the like to form the solid electrolyte layer 13 and the dielectric layer 22 in FIG. 11.

Figure 12:
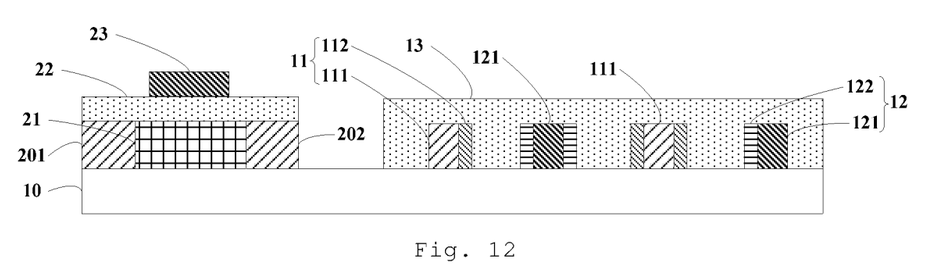

Next, as shown in FIG. 12, a gate 23 is formed on the dielectric layer 22 by processes such as deposition, etching, and the like.

Next, a planarization layer 24 is formed on the structure shown in FIG. 12 by processes such as deposition and planarization, thereby forming the structure shown in FIG. 2.

So far, a manufacturing method for a semiconductor device according to some embodiments of the present disclosure is provided. In the manufacturing method, after the anode current collector and the cathode current collector for the thin film battery, and the first electrode, the second electrode and the active layer for the thin film transistor are formed, the anode layer is first formed, and then the cathode layer is formed, thereby forming the anode structure and the cathode structure, and then forming other structures of the thin film battery and the thin film transistor. With the manufacturing method, the thin film battery and the thin film transistor are integrated on the same substrate.

In other embodiments, after the structure shown in FIG. 6 is formed, the cathode layer is first formed, and then the anode layer is formed to form the cathode structure and the anode structure respectively, thereby forming the structure shown in FIG. 10. Then, other structures of the thin film battery and the thin film transistor are formed. In this way, the semiconductor device shown in FIG. 2 can also be formed.

In other embodiments, the anode layer and the cathode layer may be formed respectively by a three-dimensional printing process. Then, the anode layer is disposed on a side surface of the anode current collector in the structure shown in FIG. 6, and the cathode layer is disposed on a side surface of the cathode current collector in the structure shown in FIG. 6, thereby forming the structure shown in FIG. 10. Then, other structures of the thin film battery and the thin film transistor are formed. In this way, the semiconductor device shown in FIG. 2 can also be formed. This method is easier to implement.

In some embodiments, the semiconductor device shown in FIG. 2 may be applied to the energy collection of the nano-generator to form a power generating device with a self-driven energy storage function.

Figure 13:
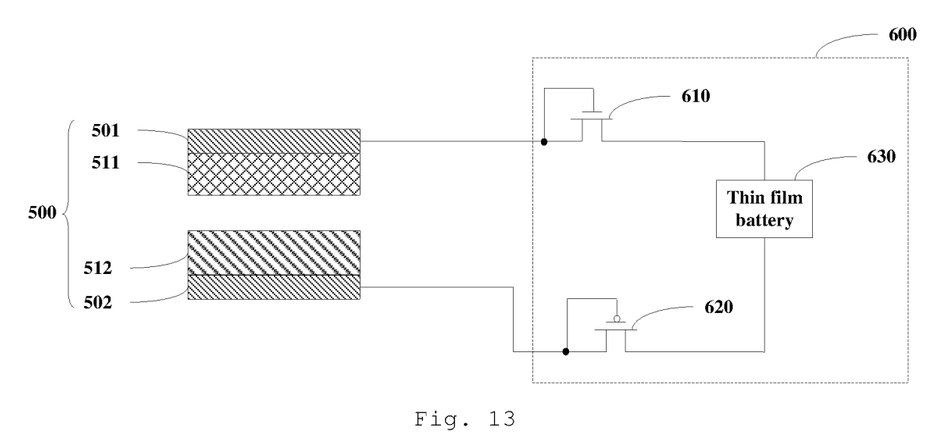
FIG. 13 is a schematic view showing a structure of a power generating device according to an embodiment of the present disclosure.

FIG. 13 is a schematic view showing a structure of a power generating device according to an embodiment of the present disclosure. The power generating device according to some embodiments of the present disclosure will be described in detail below in conjunction with FIG. 13.

As shown in FIG. 13, the power generating device comprises a nano-generator 500 and a semiconductor device 600. The nano-generator 500 is electrically connected to the semiconductor device 600.

In some embodiments, as shown in FIG. 13, the semiconductor device 600 comprises a thin film battery 630 and at least one thin film transistor. For example, the at least one thin film transistor may comprise a first thin film transistor 610 and a second thin film transistor 620. For example, the first thin film transistor 610 is an NMOS transistor, and the second thin film transistor 620 is a PMOS transistor. The first thin film transistor 610, the second thin film transistor 620 and the thin film battery 630 are integrated on the same substrate.

In some embodiments, the nano-generator may be a friction nano-generator. For example, as shown in FIG. 13, the nano-generator 500 may comprise a first electrode layer (or referred to as an upper electrode) 501, a second electrode layer (or referred to as a lower electrode) 502, and a first material layer 511 and a second material layer 512 between the first electrode layer 501 and the second electrode layer 502. The first material layer 511 is in contact with the first electrode layer 501, and the second material layer 512 is in contact with the second electrode layer 502. The first material layer 511 and the second material layer 512 have different electron bound capabilities. For example, a material of the first material layer 511 may comprise polytetrafluoroethylene or the like, and a material of the second material layer 512 may comprise nylon or the like.

In some embodiments, as shown in FIG. 13, a first electrode of the first thin film transistor 610 is electrically connected to the anode current collector (not shown in FIG. 13) of the thin film battery. A second electrode and a gate of the first thin film transistor 610 each is electrically connected to the first electrode layer 501 of the nano-generator 500. A first electrode of the second thin film transistor 620 is electrically connected to the cathode current collector (not shown in FIG. 13) of the thin film battery 630. A second electrode and a gate of the second thin film transistor 620 each is electrically connected to the second electrode layer 502 of the nano-generator.

In the above-described power generating device, the first and second electrode layers of the nano-generator are connected to the anode current collector and the cathode current collector of the thin film battery through the thin film transistors as switches respectively.

When the nano-generator 500 generates flowing charges during a friction process, positive charges flow to the anode current collector of the thin film battery 630 through the first thin film transistor (for example, an NMOS transistor) 610 by the first electrode layer 501 of the nano-generator, and electrons flow to the cathode current collector of the thin film battery 630 through the second thin film transistor (for example, a PMOS transistor) 620 by the second electrode layer 502 of the nano-generator, thereby implementing collecting charges.

When the nano-generator 500 generates reverse-flowing charges during the friction process, electrons flow out of the first electrode layer 501 of the nano-generator, and positive charges flow out of the second electrode layer 502 of the nano-generator. Since the first thin film transistor 610 is an NMOS transistor, when the electrons reaches the gate of the first thin film transistor 610, the first thin film transistor is turned off, so that the electrons cannot reach the anode current collector of the thin film battery 630. Since the second thin film transistor 620 is a PMOS transistor, when the positive charges reach the gate of the second thin film transistor 620, the second thin film transistor is turned off, so that the positive charges cannot reach the cathode current collector of the thin film battery 630. In this way, the reverse-flowing charges are obstructed. Therefore, the above-described power generating device may achieve the self-driven energy storage function.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments or equivalently substitution of part of the technical features may be made without departing from the scope and spirit of the present disclosure. The scope of the present disclosure is defined by the appended claims.

What is claimed is:

1. A semiconductor device, comprising:
   a substrate;
   a thin film battery on the substrate, comprising:
   at least one anode structure on the substrate, each of which comprises an anode current collector on a surface of the substrate, and an anode layer directly on the surface of the substrate and connected to a side surface of the anode current collector;
   at least one cathode structure on the substrate, each of which comprises a cathode current collector on the surface of the substrate, and a cathode layer directly on the surface of the substrate and connected to a side surface of the cathode current collector; and
   a solid electrolyte layer spacing the at least one anode structure apart from the at least on cathode structure; and
   at least one thin film transistor on the substrate, each of which comprises:
   a first electrode on the substrate;
   a second electrode on the substrate;
   an active layer on the substrate, wherein the active layer is between the first electrode and the second electrode and connected to the first electrode and the second electrode;
   a dielectric layer on a side of the active layer facing away from the substrate; and
   a gate on a side of the dielectric layer facing away from the active layer.

2. The semiconductor device according to claim 1, wherein:
   materials of the first electrode and the second electrode are the same as a material of the anode current collector; or
   the materials of the first electrode and the second electrode are the same as a material of the cathode current collector.

3. The semiconductor device according to claim 1, wherein a material of the dielectric layer is the same as a material of the solid electrolyte layer.

4. The semiconductor device according to claim 1, wherein a material of the gate is the same as a material of the cathode current collector or a material of the anode current collector.

5. A power generating device, comprising:
   the semiconductor device according to claim 1; and
   a nano-generator electrically connected to the semiconductor device.

6. The power generating device according to claim 5, wherein:
   the nano-generator comprises a first electrode layer, a second electrode layer, and a first material layer and a second material layer between the first electrode layer and the second electrode layer, wherein the first material layer is in contact with the first electrode layer, and the second material layer is in contact with the second electrode layer; and
   the at least one thin film transistor comprises:
   a first thin film transistor, of which a first electrode is electrically connected to the anode current collector of the thin film battery, a second electrode and a gate each is electrically connected to the first electrode layer of the nano-generator;
   a second thin film transistor, of which a first electrode is electrically connected to the cathode current collector of the thin film battery, and a second electrode and a gate each is electrically connected to the second electrode layer of the nano-generator.

7. The power generating device according to claim 6, wherein the first thin film transistor is an NMOS transistor, and the second thin film transistor is a PMOS transistor.

8. A manufacturing method for a semiconductor device, comprising:
   forming at least one anode structure and at least one cathode structure on a substrate, wherein each of the at least one anode structure comprises an anode current collector on a surface of the substrate and an anode layer directly on the surface of the substrate and connected to a side surface of the anode current collector, and each of the at least one cathode structure comprises a cathode current collector on the surface of the substrate and a cathode layer directly on the surface of the substrate and connected to a side surface of the cathode current collector; and
   forming a solid electrolyte layer on the substrate, the at least one anode structure and the at least one cathode structure, wherein the solid electrolyte layer spaces the at least one anode structure apart from the at least one cathode structure;
   wherein the manufacturing method further comprises:
   forming at least one thin film transistor on the substrate, wherein each of the at least one thin film transistor comprises:
   a first electrode on the substrate;
   a second electrode on the substrate;
   an active layer on the substrate, wherein the active layer is between the first electrode and the second electrode and connected to the first electrode and the second electrode;
   a dielectric layer on a side of the active layer facing away from the substrate; and
   a gate on a side of the dielectric layer facing away from the active layer.

9. The manufacturing method according to claim 8, wherein the forming of the at least one anode structure and the at least one cathode structure on the substrate comprises:
   forming at least one anode current collector and at least one cathode current collector spaced apart from the at least one anode current collector on the substrate;
   filling an anode material between the at least one anode current collector and the at least one cathode current collector;
   patterning the anode material to form the anode layer, wherein the anode layer is spaced apart from the at least one cathode current collector;
   filling a cathode material between the anode layer and the at least one cathode current collector; and
   patterning the cathode material to form the cathode layer, wherein the cathode layer is spaced apart from the anode layer.

10. The manufacturing method according to claim 8, wherein the forming of the at least one anode structure and the at least one cathode structure on the substrate comprises:
   forming at least one anode current collector and at least one cathode current collector spaced apart from the at least one anode current collector on the substrate;
   filling a cathode material between the at least one anode current collector and the at least one cathode current collector;
   patterning the cathode material to form the cathode layer, wherein the cathode layer is spaced apart from the at least one anode current collector;

filling an anode material between the cathode layer and the at least one anode current collector; and patterning the anode material to form the anode layer, wherein the anode layer is spaced apart from the cathode layer.

11. The manufacturing method according to claim 8, wherein the forming of the at least one anode structure and the at least one cathode structure on the substrate comprises:

forming at least one anode current collector and at least one cathode current collector spaced apart from the at least one anode current collector on the substrate;

forming the anode layer and the cathode layer by a three-dimensional printing process respectively; and connecting the anode layer to a side surface of the at least one anode current collector, and connecting the cathode layer to a side surface of the at least one cathode current collector, wherein the cathode layer is spaced apart from the anode layer.

12. The manufacturing method according to claim 9, wherein the forming of the at least one thin film transistor on the substrate comprises:

forming the first electrode and the second electrode spaced apart from the first electrode on the substrate during the forming of the at least one anode current collector and the at least one cathode current collector;

forming the active layer between the first electrode and the second electrode on the substrate, wherein the active layer is connected to the first electrode and the second electrode;

forming the dielectric layer on the active layer during the forming of the solid electrolyte layer; and forming the gate on the dielectric layer after forming the solid electrolyte layer.

13. The manufacturing method according to claim 12, wherein:

materials of the first electrode and the second electrode are the same as a material of the anode current collector, or the materials of the first electrode and the second electrode are the same as a material of the cathode current collector.

14. The manufacturing method according to claim 12, wherein a material of the dielectric layer is the same as a material of the solid electrolyte layer.

15. The manufacturing method according to claim 12, wherein:

a material of the gate is the same as a material of the cathode current collector, or the material of the gate is the same as a material of the anode current collector.

16. The manufacturing method according to claim 10, wherein the forming of the at least one thin film transistor on the substrate comprises:

forming the first electrode and a second electrode spaced apart from the first electrode on the substrate during the forming of the at least one anode current collector and the at least one cathode current collector;

forming the active layer between the first electrode and the second electrode on the substrate, wherein the active layer is connected to the first electrode and the second electrode;

forming the dielectric layer on the active layer during the forming of the solid electrolyte layer; and forming the gate on the dielectric layer after forming the solid electrolyte layer.

* * * * *

UNITED STATES PATENT AND TRADEMARK OFFICE
CERTIFICATE OF CORRECTION

PATENT NO. : 11,646,451 B2
APPLICATION NO. : 16/765967
DATED : May 9, 2023
INVENTOR(S) : Zhidong Wang et al.

It is certified that error appears in the above-identified patent and that said Letters Patent is hereby corrected as shown below:

In the Claims

Column 13, Line 17, Claim 1, delete "on" and insert -- one --

Signed and Sealed this
Twenty-seventh Day of June, 2023

Katherine Kelly Vidal
*Director of the United States Patent and Trademark Office*